US008637978B2

(12) United States Patent
Takiar et al.

(10) Patent No.: US 8,637,978 B2
(45) Date of Patent: *Jan. 28, 2014

(54) SYSTEM-IN-A-PACKAGE BASED FLASH MEMORY CARD

(75) Inventors: Hem Takiar, Fremont, CA (US); Robert C. Miller, San Jose, CA (US); Warren Middlekauff, San Jose, CA (US); Michael W. Patterson, Portland, OR (US); Shrikar Bhagath, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 53 days.

This patent is subject to a terminal disclaimer.

(21) Appl. No.: 13/235,781

(22) Filed: Sep. 19, 2011

(65) Prior Publication Data

US 2012/0007226 A1    Jan. 12, 2012

Related U.S. Application Data

(63) Continuation of application No. 11/133,576, filed on May 19, 2005, now Pat. No. 8,022,519.

(51) Int. Cl.
*H01L 23/12*    (2006.01)
*H01L 23/02*    (2006.01)

(52) U.S. Cl.
USPC ........... 257/704; 257/679; 257/680; 257/723; 257/E23.181

(58) Field of Classification Search
USPC .......... 257/679, 678, 687, E21.504, 704, 680, 257/E23.181
See application file for complete search history.

(56) References Cited

U.S. PATENT DOCUMENTS

| | | | |
|---|---|---|---|
| D267,009 S | 11/1982 | Doi | |
| 5,285,107 A * | 2/1994 | Kazami et al. | 257/680 |
| 5,808,322 A * | 9/1998 | Nicholson et al. | 257/80 |
| D452,690 S | 1/2002 | Wallace et al. | |
| D452,864 S | 1/2002 | Wallace et al. | |
| D453,338 S | 2/2002 | Pentz et al. | |
| D453,934 S | 2/2002 | Wallace et al. | |
| 6,462,273 B1 | 10/2002 | Corisis et al. | |
| 6,567,273 B1 | 5/2003 | Liu et al. | |
| D492,314 S | 6/2004 | Huang et al. | |
| D492,688 S | 7/2004 | Wallace et al. | |
| 6,858,470 B1 | 2/2005 | Han et al. | |
| D504,433 S | 4/2005 | Nishizawa et al. | |
| 6,988,668 B2 | 1/2006 | Osako et al. | |

(Continued)

OTHER PUBLICATIONS

Notice of Allowance and Fee(s) Due dated Apr. 4, 2007, U.S. Appl. No. 29/230,382.

(Continued)

*Primary Examiner* — Nitin Parekh
(74) *Attorney, Agent, or Firm* — Vierra Magen Marcus LLP

(57) ABSTRACT

A system-in-a-package based flash memory card including an integrated circuit package occupying a small overall area within the card and cut to conform to the shape of a lid for the card. An integrated circuit may be cut from a panel into a shape that fits within and conforms to the shape of lids for a finished memory card, such as for example an SD Card. The integrated circuit package may be a system-in-a-package, a multi-chip module, or other arrangement where a complete electronic system is formed in a single package.

16 Claims, 5 Drawing Sheets

(56) References Cited

U.S. PATENT DOCUMENTS

| | | | |
|---|---|---|---|
| D517,559 S | 3/2006 | Yu et al. | |
| 7,009,846 B1* | 3/2006 | Wang et al. | 361/737 |
| D518,483 S | 4/2006 | Yu et al. | |
| D525,978 S | 8/2006 | Takiar et al. | |
| D529,030 S | 9/2006 | Nakamura et al. | |
| D529,031 S | 9/2006 | Huang et al. | |
| 7,120,029 B2* | 10/2006 | Nishizawa et al. | 361/737 |
| D534,169 S | 12/2006 | Nakamura et al. | |
| D537,081 S | 2/2007 | Takiar et al. | |
| D538,286 S | 3/2007 | Takiar et al. | |
| D548,740 S | 8/2007 | Takiar et al. | |
| 7,264,992 B2* | 9/2007 | Hsueh et al. | 438/106 |
| 8,022,519 B2* | 9/2011 | Takiar et al. | 257/678 |
| 2004/0266267 A1 | 12/2004 | Inaba | |
| 2005/0279838 A1* | 12/2005 | Wang et al. | 235/492 |
| 2006/0220202 A1* | 10/2006 | Osako et al. | 257/679 |

OTHER PUBLICATIONS

Office Action dated Nov. 30, 2006, U.S. Appl. No. 11/133,576.
Response to Office Action filed Dec. 29, 2006, U.S. Appl. No. 11/133,576.
Office Action dated Mar. 27, 2007, U.S. Appl. No. 11/133,576.
Response to Office Action filed Jul. 26, 2007, U.S. Appl. No. 11/133,576.
Notice of Non-Compliant Amendment dated Jul. 31, 2007, U.S. Appl. No. 11/133,576.
Response to Notice of Non-Compliant Amendment filed Aug. 30, 2007, U.S. Appl. No. 11/133,576.
Final Office Action dated Nov. 19, 2007, U.S. Appl. No. 11/133,576.
Response to Final Office Action filed Feb. 19, 2008, U.S. Appl. No. 11/133,576.
Office Action dated Mar. 17, 2008, U.S. Appl. No. 11/133,576.
Response to Office Action filed Jun. 17, 2008, U.S. Appl. No. 11/133,576.
Appeal Brief filed Apr. 1, 2009, U.S. Appl. No. 11/133,576.
Office Action dated Mar. 16, 2010, U.S. Appl. No. 11/133,576.
Response to Office Action filed Aug. 16, 2010, U.S. Appl. No. 11/133,576.
Ex Parte Quayle Office Action dated Dec. 28, 2010, U.S. Appl. No. 11/133,576.
Response to Ex Parte Quayle Office Action dated Feb. 28, 2011, U.S. Appl. No. 11/133,576.
Notice of Allowance and Fee(s) Due dated May 16, 2011, U.S. Appl. No. 11/133,576.

* cited by examiner

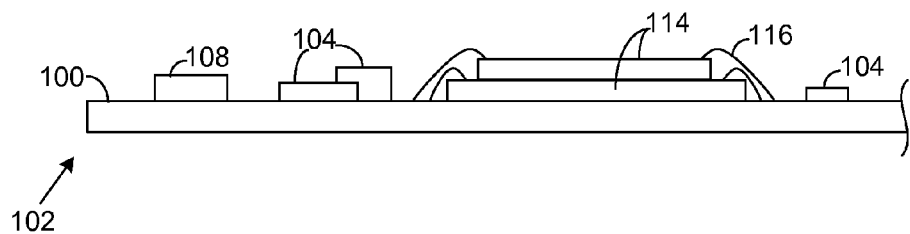
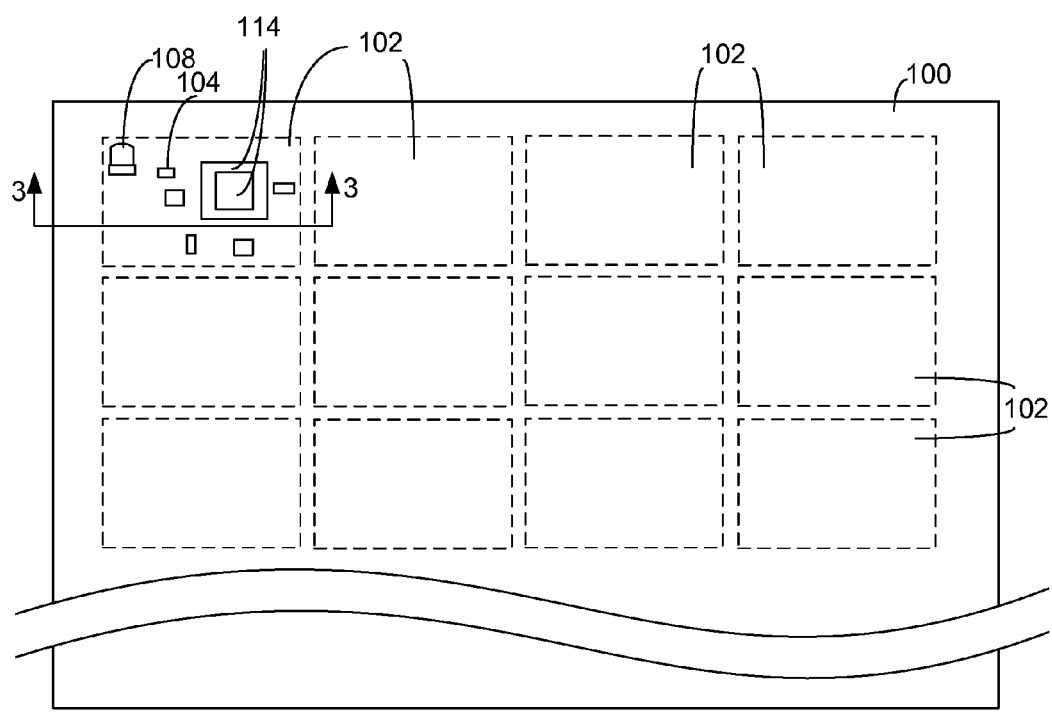

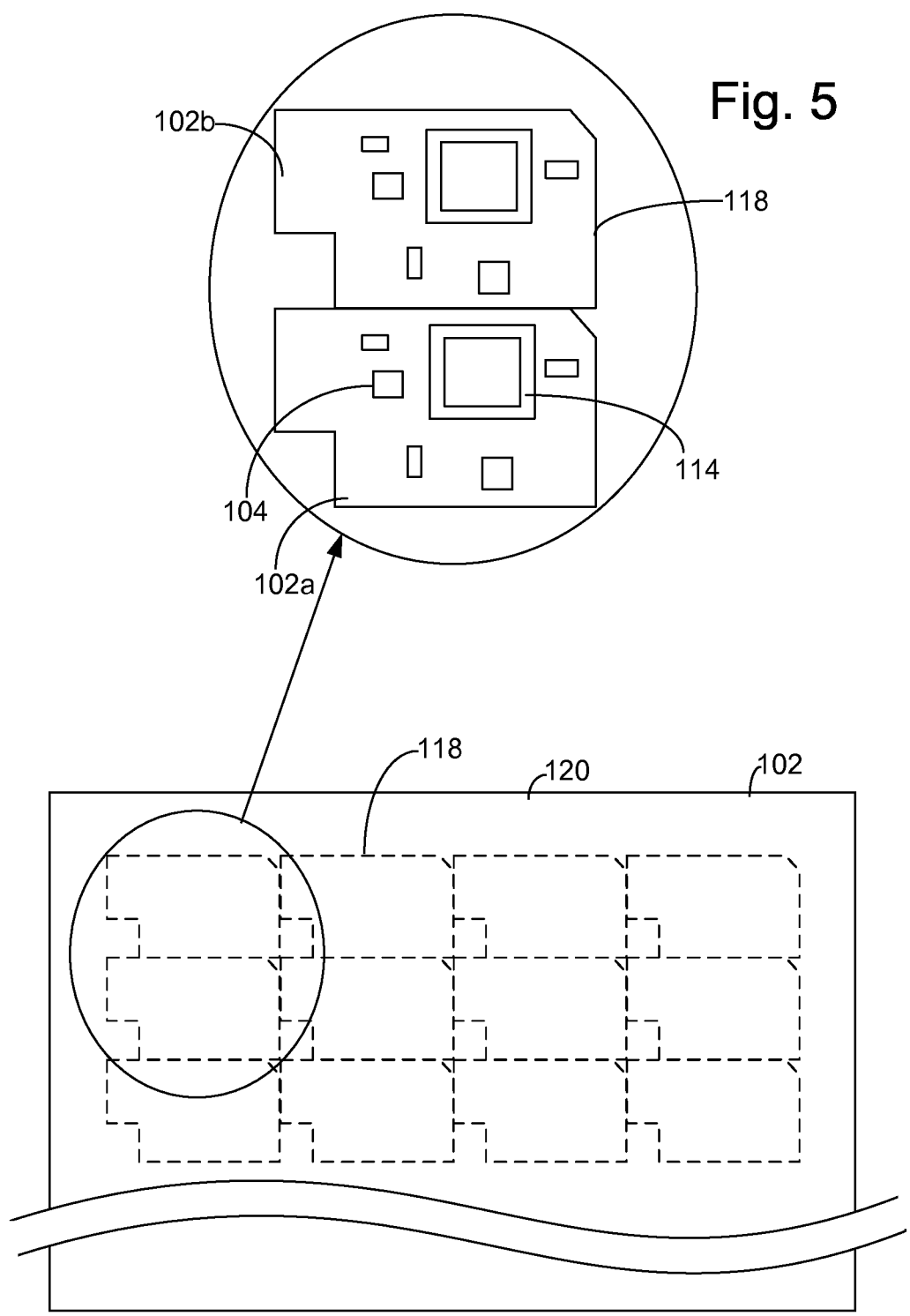

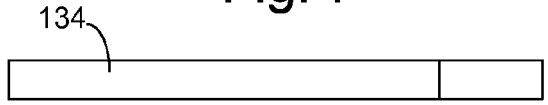
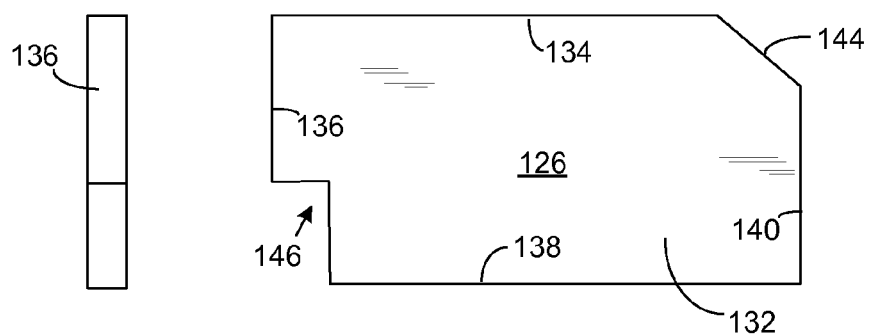
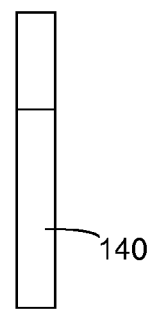
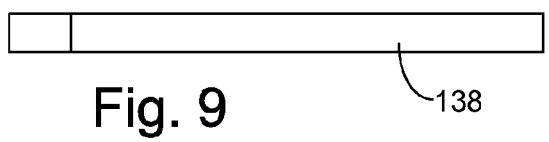
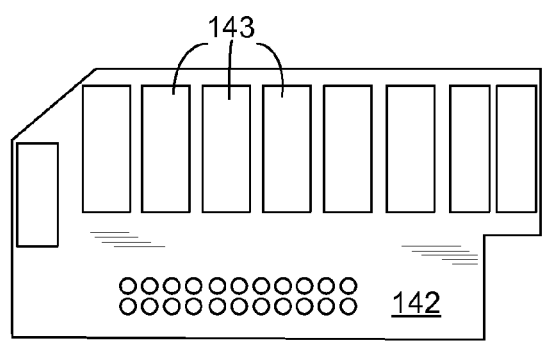

SYSTEM-IN-A-PACKAGE BASED FLASH MEMORY CARD

CLAIM OF PRIORITY

This application is a continuation of U.S. patent application Ser. No. 11/133,576 filed on May 19, 2005 entitled SYSTEM-IN-A-PACKAGE BASED FLASH MEMORY CARD, which application is incorporated herein by reference in its entirety.

BACKGROUND OF THE INVENTION

1. Field of the Invention

Embodiments of the present invention relate to a system-in-a-package based flash memory card including an integrated circuit package occupying a small overall area within the card and cut to conform to the shape of a lid for the card.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices.

One exemplary standard for flash memory cards is the so-called SD flash memory card. The SD (Secure Digital) Card is a secure flash memory about the size of a postage stamp. Jointly developed by SanDisk, Toshiba and Matsushita Electronic (which makes Panasonic products), the SD Card weighs approximately two grams and is used for memory storage in a wide variety of digital products, including for example digital music players, cellular phones, handheld PCs (HPCs), digital cameras, digital video camcorders, smart phones, car navigation systems and electronic books.

In the past, electronic devices such as SD cards have included an integrated circuit ("IC") system consisting of several individually packaged ICs each handling different functions, including logic circuits for information processing, memory for storing information, and I/O circuits for information exchange with the outside world. The individually packaged ICs have been mounted separately on a substrate such as a printed circuit board to form the IC system. In conventional SD Cards including individually packaged components on a printed circuit board, the printed circuit board took up all or almost all of the available space within the card. The printed circuit board was formed to that size in order to contain all of the individually packaged components.

More recently, system-in-a-package ("SiP") and multichip modules ("MCM") have been developed where a plurality of integrated circuit components have been packaged together to provide a complete electronic system in a single package. Typically, an MCM includes a plurality of chips mounted side by side on a substrate and then packaged. An SiP typically includes a plurality of chips, some or all of which may be stacked on a substrate and then packaged.

SUMMARY OF THE INVENTION

Embodiments of the present invention relate to a system-in-a-package based flash memory card including an integrated circuit ("IC") package occupying a small overall area within the card and cut to conform to the shape of a lid for the card. An integrated circuit may be cut from a panel into a shape that fits within and conforms to the shape of lids for a finished memory card, such as for example an SD Card. The integrated circuit package may be a system-in-a-package, a multi-chip module, or other arrangement where a complete electronic system is formed in a single package.

In embodiments, the IC package is cut with a chamfer that matches up with and conforms to the size and shape of a chamfer formed in a lid for an SD flash memory card. Similarly, the IC package is also cut with a notch that is sized and positioned so as to define a space in which a read/write switch in the SD flash memory card may operate. Moreover, forming all of the IC components within an SiP or similar package provides a significant savings of space within the finished flash memory card in comparison to conventional printed circuit boards including individually packaged components. Whereas the printed circuit board with individually packaged components took up all or substantially all of the available space within a standard SD Card, the IC package takes up less than one-half of the available space in the flash memory card of the present invention.

BRIEF DESCRIPTION OF THE DRAWINGS

FIG. 2 is a top view of a panel of integrated circuits during the fabrication process according to the present invention.

FIG. 3 is a cross-sectional view through line 3-3 in FIG. 2.

FIG. 4 is a top view of a panel of molded integrated circuits according to embodiments of the present invention prior to being cut into individual integrated circuit packages.

FIG. 5 is an enlarged view of a pair of integrated circuits with the internal components and cut lines shown.

FIG. 6 is a top view of an integrated circuit package according to embodiments of the present invention.

FIG. 7 is an edge view of a first edge of the integrated circuit package according to embodiments of the present invention.

FIG. 8 is an edge view of a second edge of the integrated circuit package according to embodiments of the present invention.

FIG. 9 is an edge view of a third edge of the integrated circuit package according to embodiments of the present invention.

FIG. 10 is an edge view of a fourth edge of the integrated circuit package according to embodiments of the present invention.

FIG. 11 is a bottom view of an integrated circuit package according to embodiments of the present invention.

DETAILED DESCRIPTION

Figure 1:
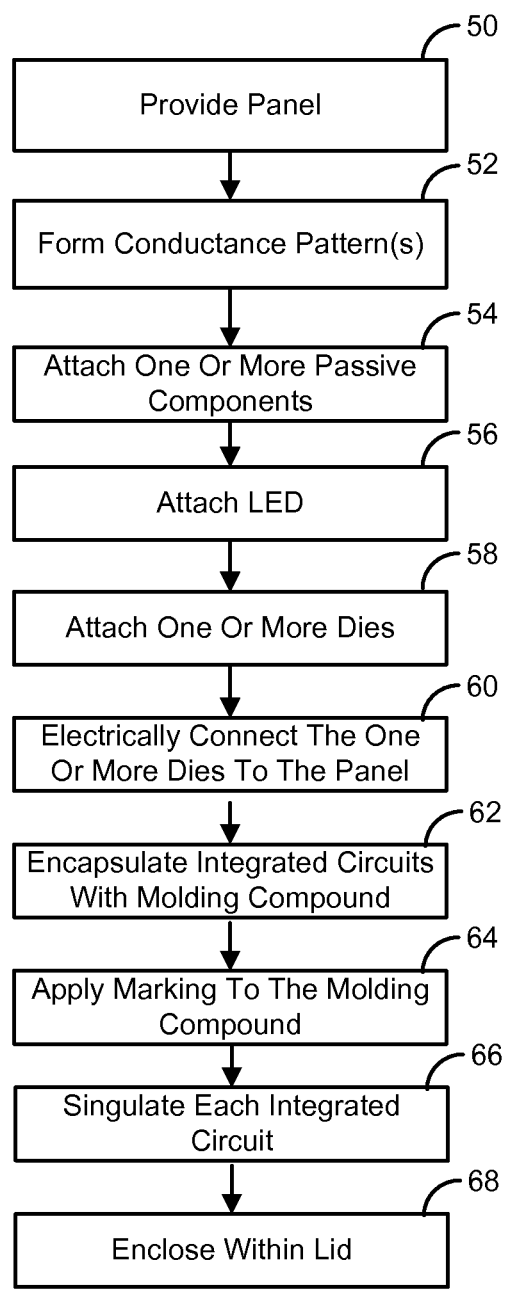
FIG. 1 is a flowchart of the method of fabricating a flash memory card according to embodiments of the present invention.

Embodiments of the invention will now be described with reference to FIGS. 1 through 14 which relate to a system-in-a-package based flash memory card including an integrated circuit package fitting within the footprint of a lid for the package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

A method for forming a flash memory card according to embodiments of the present invention will now be described with reference to the flowchart of FIG. 1. The fabrication process begins in step 50 with a panel 100 (FIGS. 2 and 3). The type of panel 100 used in the present invention is not critical and may for example be a substrate in the form of a printed circuit board ("PCB"), a lead frame, a tab automated bonding ("TAB") tape or other known base on which integrated circuits may be assembled and encapsulated. In an embodiment, panel 100 may be a PCB substrate formed of a dielectric core having a conductive layer formed on the top and/or bottom surface of the core. In step 52, a conductance pattern may be formed on one or both conductive layers of panel 100 to establish an electrical connection between the components mounted on panel 100. The conductance pattern may further include contact pads, lead fingers or other external connectors for electrical connection between the integrated circuit components and external electronic devices.

A plurality of discrete integrated circuits 102 may be batch processed on panel 100 to achieve economies of scale. Each of these integrated circuits 102 may then be encapsulated and singulated to form a plurality of integrated circuit packages as explained hereinafter. Each integrated circuit 102 being formed on panel 100 may include one or more passive components 104 surface mounted to panel 100 in step 54. The type and number of passive components 104 is not critical to the present invention and may vary widely in alternative embodiments. In an embodiment, the passive components 104 may include capacitors and/or resistors physically and electrically coupled to panel 100 as is known in the art.

Embodiments of the present invention may further include a light emitting diode ("LED") 108 surface mounted to panel 100 in a step 56. The LED 108 may be embedded within the finished package and have an active end emitting light out of an edge of the finished package. A package including such an LED is described in U.S. Utility patent application Ser. No. 11/129,637, entitled "Method Of Assembling Semiconductor Devices With LEDs," by Takiar et al., filed May 13, 2005, which application has been incorporated by reference herein in its entirety. LED 108 may be omitted in embodiments of the invention.

Each integrated circuit 102 may further include one or more semiconductor die 114 mounted to panel 100 in step 58 in a known adhesive or eutectic die bond process, using a known die-attach compound. The number and type of semiconductor die 114 may vary greatly in alternative embodiments of the invention. In one embodiment, the one or more die 114 may include a flash memory array (e.g., NOR, NAND or other), SRAM or DDT, and/or a controller chip such as an ASIC. Other semiconductor die are contemplated. The one or more die 114 may be electrically connected to panel 100 by wire bonds 116 in step 60 in a known wire-bond process.

While the mounting of the passive components, the LED and the semiconductor die are disclosed as separate steps in the flowchart of FIG. 1, it is understood that these steps may be performed in different orders, and all together in alternative embodiments. Although not specifically shown on the flowchart of FIG. 1, various visual and automated inspections may be made during the above-described fabrication of the plurality of integrated circuits 102 on panel 100.

Once the plurality of integrated circuits 102 have been formed on panel 100, each of the integrated circuits 102 may be encapsulated with a molding compound 120 in step 62 and as shown in FIGS. 3 and 4. Molding compound 120 may be an epoxy available for example, from Nitto Denko Corporation, Osaka, Japan. The molding compound may be applied according to various processes, including by transfer molding or flood molding techniques, to form a unitary encapsulation on panel 100 encompassing all of the integrated circuits 102.

After molding step 62, a marking can be applied to the molding compound 120 in step 64. The marking may for example be a logo or other information printed on the surface of the molding compound for each integrated circuit 102. The marking may for example indicate manufacturer and/or type of device. Marking step 64 may be omitted in alternative embodiments of the present invention.

Each of the integrated circuits 102 may then be singulated in step 66. Singulation step 66 involves cutting integrated circuits 102 on panel 100 into a plurality of individual integrated circuit packages. As used herein, the term "cutting" is used to refer to cutting, sawing, punching or other methods used to separate the integrated circuits 102 into individual integrated circuit packages. Known cutting devices include, for example, water jet cutting, laser cutting, water guided laser cutting, dry media cutting, and diamond coated wire. Water jet cutting may be the preferred cutting device given its small cutting width (e.g., 50 microns), its ability to shape small features, and its rapid cutting rate. Water can also be used together with laser cutting to help complement or focus its effects. As is known in the art, the above cutting methods are able to achieve sophisticated rectilinear and/or curvilinear shapes of the individualized integrated circuit packages. A further description of the cutting of integrated circuits from a panel and the shapes which may be achieved thereby is disclosed in U.S. Publication No. 2004/0259291, entitled, "Method For Efficiently Producing Removable Peripheral Cards," which application is assigned to the owner of the present invention and which application is incorporated by reference herein in its entirety. It is understood that the singulated integrated circuits may be formed by other processes than that described above in alternative embodiments.

In embodiments of the present invention, each of the integrated circuits may be cut from panel 100 into a shape that fits within and conforms to the shape of lids for a finished memory card as explained in greater detail hereinafter. An outline of the cutting shape in one embodiment is shown in dashed lines 118 on the top view of the encapsulated panel in FIG. 4. As can be seen from the enlarged view of FIG. 5, the integrated circuits 102 are cut from panel 100 so that the one or more die 114 and passive components 106 are entirely contained and enclosed within each singularized package. Such a package may form a system-in-a-package ("SiP"). The package may alternatively form a multi-chip module ("MCM") configuration, or other arrangement where a complete electronic system is formed in a single package. Such packages take up considerably less room in the finished flash memory card in comparison to prior art flash memory cards.

An example of an integrated circuit ("IC") package 126 which may be obtained by the above-described process is shown in FIGS. 6 through 10. FIG. 6 is a top view of an IC package 126 cut from panel 100 and including integrated circuit 102 encapsulated within molding compound 124 as described above. IC package 126 may include a top surface 132, a first edge 134, a second edge 136, a third edge 138 and a fourth edge 140 around a periphery of the package. FIGS. 7 through 10 are edge views of the first through fourth edges, respectively, of package 126. FIG. 11 is a view of a bottom surface 142 of IC package 126 showing contact fingers 143 for establishing an electrical connection in the finished flash memory card between the card and a host electronic device. Where IC package 126 is used in an SD Card, IC package 126 may be built as a land grid array (LGA) package. Other types of packages, such as pin grid array (PGA) and ball grid array (BGA) packages are contemplated.

A chamfer 144 is formed in a corner between first edge 134 and fourth edge 140 for conforming to a chamfer in a flash memory card lid as explained in greater detail below. A notch 146 may be formed in a corner between second edge 136 and third edge 138 for location of a switch in a flash memory card lid as explained in greater detail below.

Figure 12:
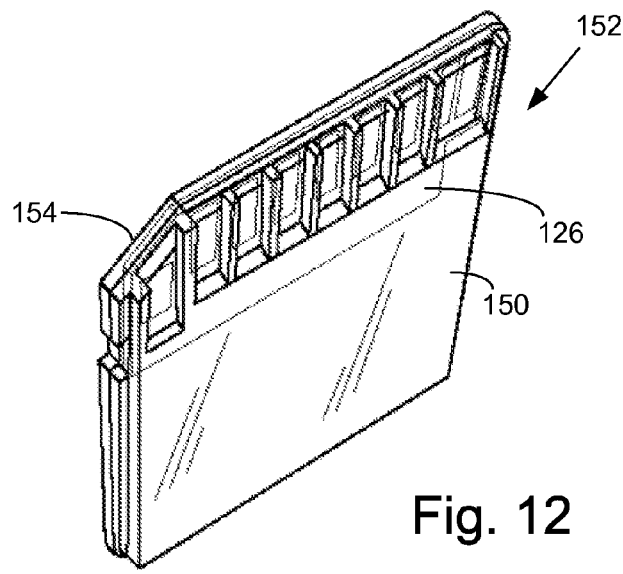
FIG. 12 is a perspective view of a flash memory card including the integrated circuit package of FIG. 6 mounted in a top and bottom lid.
Figures 13, 14:
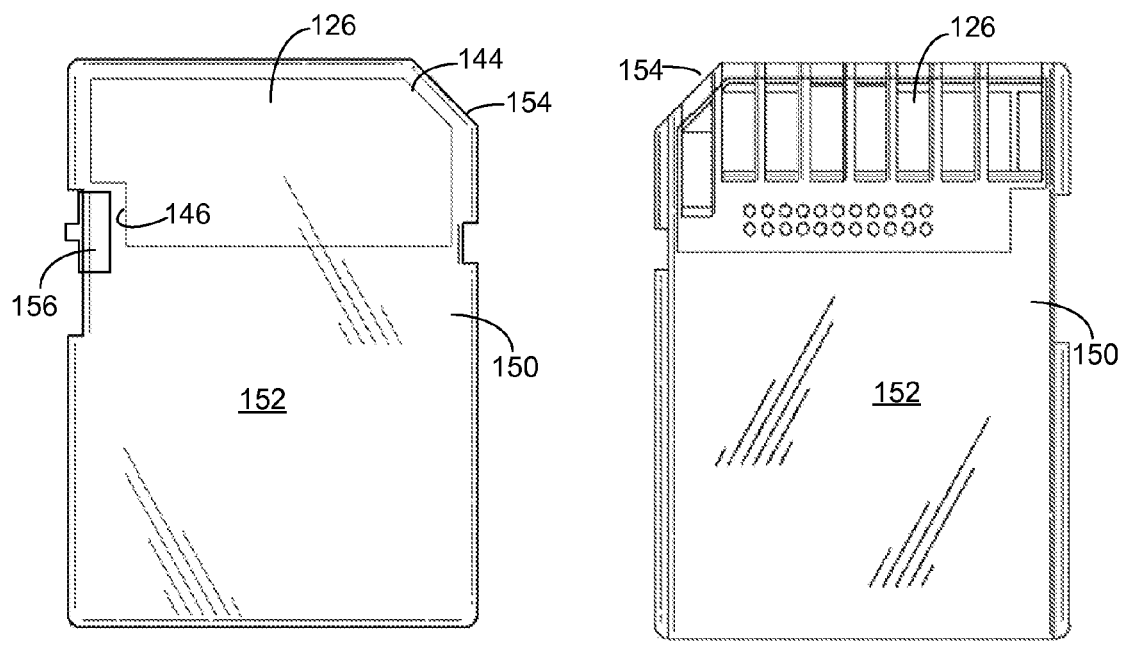
FIG. 13 is a top view of a flash memory card including the integrated circuit package of FIG. 6 mounted in a top and bottom lid.
FIG. 14 is a bottom view of a flash memory card including the integrated circuit package of FIG. 6 mounted in a top and bottom lid.

Referring again to the flowchart of FIG. 1 and the views of FIGS. 12-14, a completed IC package 126 may further be enclosed within an external package or lid (or pair of lids) 150 in step 68. Such a lid would provide an external covering for the IC package 126 and establish external product features. For example, as indicated above, IC package 126 may be shaped for use within an SD Card 152 having a standard SD Card lid configuration and footprint. In such an embodiment, the lid 150 includes a chamfer 154 between a first pair of edges to prevent the card from being improperly inserted into a standard SD card slot on a host device. In particular, each card slot would include an angled corner which mates with chamfer 154 when card 152 is properly inserted, but would prevent the card 152 from being fully inserted if some other corner of the card 152 was inserted against the angled corner within the host slot.

As indicated above, IC package 126 includes the chamfer 144. The IC package 126 is cut so that chamfer 144 matches up with and conforms to the size and shape of chamfer 154. Similarly, standard SD cards are formed with a switch 156 which cooperates with mechanisms in the host device to enable and disable read/write operations from/to the card. The IC package 126 is cut so that the notch 146 in package 126 is sized and positioned to not interfere with the switch 156 as it moves between its enable and disable positions.

Additionally, forming all of the IC components within package 126 provides a significant savings of space within the lids 150 in comparison to conventional printed circuit boards including individually packaged components. Whereas the printed circuit board with individually packaged components took up all or substantially all of the available space within a standard SD Card, the IC package 126 occupies only a fraction of the available space. In an embodiment, IC package 126 may have a maximum length (between the second edge 136 and fourth edge 140) of approximately 2 cm, and a maximum width (between the first edge 134 and third edge 138) of approximately 1 cm. With these dimensions, the IC package takes up less than one-half of the available space in card 152. It is understood that the IC package 126 may occupy more than one-half of the available space within card 152, such as for example three-fourths of the available space in card 152.

Embodiments of the present invention have been described including an IC package which fits within the footprint of a standard SD card. However, it is understood that embodiments of the present invention may alternatively shape an SiP, MCM, or other arrangement where a complete electronic system is formed in a single package to fit within an outer lid or enclosure in a number of other flash memory standards. Such standards include but are not limited to a Compact Flash, a Smart Media, a Mini SD Card, an MMC, an xD Card, a Transflash or a Memory Stick. Other devices are contemplated.

In summary, an example of the present technology relates to an integrated circuit for a flash memory card, the flash memory card including one or more external lids, the integrated circuit comprising: a plurality of integrated circuit components packaged together in a single package, the package cut to a shape to fit within the one or more external lids and the package having one or more sides cut to a shape to conform to a shape of the one or more external lids.

In a further example, the present technology relates to a flash memory card, comprising: an integrated circuit package including a complete electronic system formed in a single package; one or more external lids for encasing the integrated circuit package, the integrated circuit package cut to a shape to fit within the one or more external lids and the integrated circuit package having one or more sides cut to a shape to conform to a shape of the one or more external lids.

In a further example, the present technology relates to an integrated circuit for a flash memory card, the flash memory card including one or more external lids, the integrated circuit comprising: a substrate; a plurality of integrated circuit components mounted on the substrate; molding compound encapsulating the plurality of integrated circuit components on the substrate to form a package, the encapsulated package cut to a shape to include a notch, the notch corresponding to a notch formed in the one or more external lids.

In a further example, the present technology relates to a flash memory card, comprising: an integrated circuit package including a complete electronic system encapsulated in molding compound to form a single package, the integrated circuit package having first, second, third and fourth edges, the integrated circuit package cut with a chamfer between the first and fourth edges and a notch in a corner where the second and third edges come together; one or more lids for encasing the integrated circuit package, the lids having a configuration for a standard SD Card, the chamfer of the integrated circuit package conforming to the shape of a chamfer formed in the one or more lids, and the notch of the integrated circuit package defining a space between the one or more lids in which a switch in the flash memory card travels without contacting the second edge or the third edge of the integrated circuit package.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An integrated circuit and one or more external lids for a flash memory card, comprising:
   a plurality of integrated circuit components packaged together in a single package, the package having first, second, third and fourth edges and cut to a shape to fit within the one or more external lids and the package having one or more sides cut to a shape to conform to a shape of the one or more external lids and a notch in a corner where the second and third edges come together; and wherein the one or more external lids encase the integrated circuit package, the one or more external lids having a configuration for a standard SD Card, the notch of the integrated circuit package defining a space between the one or more external lids in which a switch in the flash memory card travels without contacting the second edge or the third edge of the integrated circuit package.

2. An integrated circuit as recited in claim 1, the single package forming a complete electronic system.

3. An integrated circuit as recited in claim 1, the single package being a system-in-a-package.

4. An integrated circuit as recited in claim 1, wherein three sides of the single package are cut to a shape to conform to a shape of the one or more external lids.

5. An integrated circuit as recited in claim 1, the integrated circuit package occupying less than three-fourths of the area of the one or more external lids.

6. An integrated circuit as recited in claim 1, the integrated circuit package occupying less than one-half of the area of the one or more external lids.

7. A flash memory card, comprising:

an integrated circuit package including a complete electronic system formed in a single package the package including first, second, third and fourth edges and a notch between the third and fourth edges;

one or more external lids for encasing the integrated circuit package, the integrated circuit package cut to a shape to fit within the one or more external lids and the integrated circuit package having one or more sides cut to a shape to conform to a shape of the one or more external lids, the notch of the integrated circuit package defining a space between the one or more external lids in which a switch in the flash memory card travels without contacting the second edge or the third edge of the integrated circuit package.

8. A flash memory card as recited in claim 7, the flash memory card being an SD Card.

9. A flash memory card as recited in claim 8, the integrated circuit package cut to include a chamfer cut to conform to a shape of a chamfer in the one or more external lids.

10. A flash memory card as recited in claim 8, the integrated circuit package cut to include a notch defining a space in which a switch in the SD Card may operate.

11. A flash memory card as recited in claim 7, the integrated circuit package being a system-in-a-package.

12. A flash memory card as recited in claim 7, the integrated circuit package being a multi-chip module.

13. A flash memory card as recited in claim 7, wherein three sides of the single package are cut to a shape to conform to a shape of the one or more external lids.

14. A flash memory card as recited in claim 7, the integrated circuit package occupying less than three-fourths of the area of the one or more external lids.

15. A flash memory card as recited in claim 7, the integrated circuit package occupying less than one-half of the area of the one or more external lids.

16. A flash memory card as recited in claim 7, wherein the one or more external lids are translucent, the integrated circuit package being visible through the one or more external lids.

* * * * *